United States Patent
Miyahara et al.

(10) Patent No.: US 8,507,312 B2
(45) Date of Patent: Aug. 13, 2013

(54) PHOTOELECTRIC-CONVERSION-DEVICE FABRICATION METHOD

(75) Inventors: Hiroomi Miyahara, Tokyo (JP); Saneyuki Goya, Tokyo (JP); Satoshi Sakai, Tokyo (JP); Tatsuyuki Nishimiya, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 13/388,297

(22) PCT Filed: May 7, 2010

(86) PCT No.: PCT/JP2010/057784
§ 371 (c)(1),
(2), (4) Date: Jan. 31, 2012

(87) PCT Pub. No.: WO2011/070805
PCT Pub. Date: Jun. 16, 2011

(65) Prior Publication Data
US 2012/0135561 A1 May 31, 2012

(30) Foreign Application Priority Data

Dec. 11, 2009 (JP) .................................. 2009-282141

(51) Int. Cl.
*H01L 21/00* (2006.01)

(52) U.S. Cl.
USPC .......................................................... 438/87

(58) Field of Classification Search
USPC .......................................................... 438/87
See application file for complete search history.

(56) References Cited

U.S. PATENT DOCUMENTS

2009/0183775 A1   7/2009   Goya et al.

FOREIGN PATENT DOCUMENTS

| JP | 2000182975 A | 6/2000 |
|----|--------------|--------|
| JP | 2008066343 A | 3/2008 |
| JP | 2009194394 A | 8/2009 |

OTHER PUBLICATIONS

Kondo, M. "Microcrystalline materials and cells deposited by RF glow discharge" Solar Energy Materials & Solar Cells 78 Iss. 1-4 Jul. 2003 pp. 543-566.*
Japanese Office Action for JP2009282141, issued May 15, 2012.
Hiroshi Yamamoto et al., "The effect of impurities in microcrystalline silicon", 45th Spring Meeting Proceedings (28aYM-5), Japan Society of Applied Physics, Mar. 28, 1998, vol. 2, p. 894.
Kinoshita, et al., "Influence of Oxygen and Nitrogen in the Intrinsic Layer of a-Si:H Solar Cells", Japan Journal of Applied Physics, Jul. 1996, Col. 35, Part 1, No. 7, pp. 3819-3824.
International Search Report for PCT/JP2010/057784, mailed Aug. 17, 2008.

* cited by examiner

*Primary Examiner* — Jae Lee
*Assistant Examiner* — Grant Withers
(74) *Attorney, Agent, or Firm* — Kanesaka Berner & Partners, LLP

(57) ABSTRACT

An object is to obtain a high-efficiency photoelectric conversion device having a crystalline silicon i-layer in a photoelectric conversion layer. Disclosed is a fabrication method for a photoelectric conversion device that includes a step of forming, on a substrate, a photoelectric conversion layer having an i-layer formed mainly of crystalline silicon. The method includes the steps of determining an upper limit of an impurity concentration in the i-layer according to the Raman ratio of the i-layer; and forming the i-layer so as to have a value equal to or less than the determined upper limit of the impurity concentration. Alternatively, an upper limit of impurity-gas concentration in a film-formation atmosphere is determined according to the Raman ratio of the i-layer, and the i-layer is formed while controlling the impurity-gas concentration so as to have a value equal to or less than the determined upper limit.

6 Claims, 9 Drawing Sheets

FIG. 3
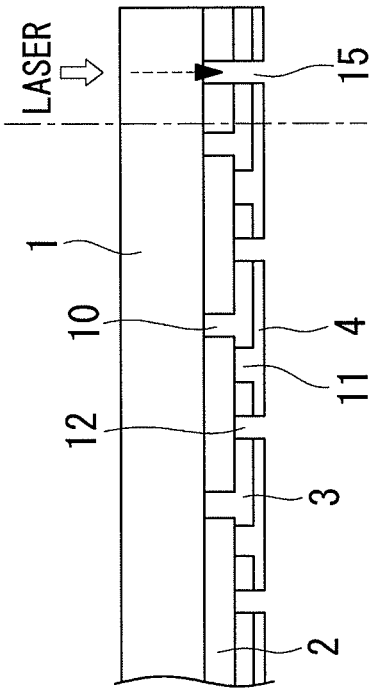 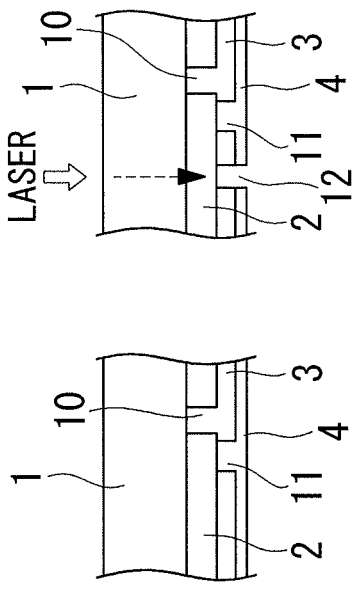

FIG. 4
(a) 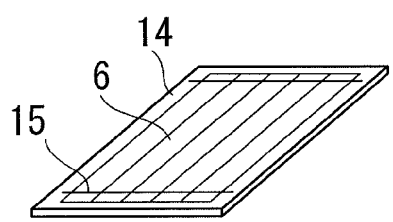
(b) 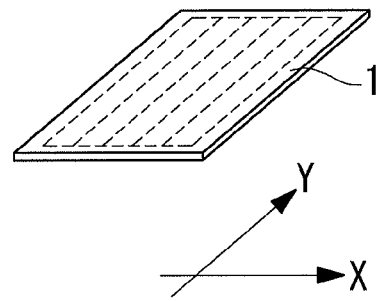

US 8,507,312 B2

PHOTOELECTRIC-CONVERSION-DEVICE FABRICATION METHOD

The present Application is the U.S. National Stage of International Application No. PCT/JP2010/057784, filed on May 7, 2010; which Application claims priority benefit of Japanese Application No. 2009-282141, filed Dec. 11, 2009.

TECHNICAL FIELD

The present invention relates to a photoelectric-conversion-device fabrication method and, particularly, to a fabrication method for a thin-film solar cell fabricated by forming a power generation layer.

BACKGROUND ART

As a photoelectric conversion device for converting sunlight energy into electrical energy, there is a known thin-film silicon solar cell having a photoelectric conversion layer fabricated by forming thin films of a p-type silicon semiconductor (p-layer), an i-type silicon semiconductor (i-layer), and an n-type silicon semiconductor (n-layer) by using a plasma CVD method or the like. Thin-film silicon solar cells have the advantages that the area thereof can be easily increased, and only a small amount of material is used because the film thickness thereof is about one hundredth of that of crystalline solar cells. Therefore, thin-film silicon solar cells can be fabricated at lower cost than crystalline solar cells.

In general, a film formed mainly of amorphous silicon or a film formed mainly of crystalline silicon is used as a photoelectric conversion layer used for the thin-film silicon solar cell. For solar cells having an amorphous silicon film as the photoelectric conversion layer, it is known that impurities (oxygen and nitrogen) in the photoelectric conversion layer influence the cell performance (NPL 1).

PTL 1 discloses that there is a correspondence relationship between the Raman ratio (ratio of crystallization) of a crystalline silicon film and the cell efficiency, in a solar cell having a film formed mainly of crystalline silicon as a photoelectric conversion layer.

CITATION LIST

Patent Literature

{PTL 1} Japanese Unexamined Patent Application, Publication No. 2008-66343 (Paragraphs [0037] to [0038], FIGS. 7 to 8)

Non Patent Literature

{NPL 1} Kinoshita et al., "Influence of Oxygen and Nitrogen in the Intrinsic Layer of a-Si:H Solar Cells", Japan Journal of Applied Physics, July 1996, Vol. 35, Part 1, No. 7, pp. 3819-3824 (FIG. 7, Section 3.2.1)

SUMMARY OF INVENTION

Technical Problem

It is conceivable that impurities in the crystalline silicon layer influence the cell performance, even in a crystalline silicon solar cell. However, the correspondence relationship between the impurity concentration and the Raman ratio of the crystalline silicon layer was not clear.

An object of the present invention is to obtain a high-efficiency photoelectric conversion device having a crystalline silicon i-layer in a photoelectric conversion layer.

Solution to Problem

In order to solve the above-described problems, the present invention provides a photoelectric-conversion-device fabrication method that includes a step of forming, on a substrate, a photoelectric conversion layer having an i-layer formed mainly of crystalline silicon, the method including the steps of: determining an upper limit of an impurity concentration in the i-layer according to the Raman ratio of the i-layer; and forming the i-layer so as to have a value equal to or less than the determined upper limit of the impurity concentration.

From investigation by the inventors of the present invention, it was found that the cell performance of the photoelectric conversion device having the crystalline silicon i-layer is likely to be influenced more strongly by the impurity concentration in the film as the Raman ratio becomes higher, and the conversion efficiency is remarkably reduced by an increase in the impurity concentration in the film. From this knowledge, it can be said that the permissible amount of the impurity concentration in the crystalline silicon i-layer differs depending on the Raman ratio of the crystalline silicon i-layer. In the present invention, it is possible to fabricate a photoelectric conversion device with excellent cell performance when film formation is performed while controlling the impurity concentration in the crystalline silicon i-layer so as not to exceed the upper limit of the impurity concentration determined according to the Raman ratio.

Note that the Raman ratio used in the present invention is defined by the ratio Ic/Ia of the peak intensity Ic of a crystalline silicon phase at 520 $cm^{-1}$ to the peak intensity Ia of an amorphous silicon phase at 480 $cm^{-1}$, in a raman spectrum measured by using laser light having a wavelength of 532 nm.

In the above-described invention, it is preferable that the upper limit of the impurity concentration be set to: $5\times10^{18}$ $cm^{-3}$ when the Raman ratio falls within the range from 3.5 to 4.5; $2\times10^{18}$ $cm^{-3}$ when the Raman ratio falls within the range from 4.5 to 5.5; $8\times10^{17}$ $cm^{-3}$ when the Raman ratio falls within the range from 5.5 to 6.5; $7\times10^{17}$ $cm^{-3}$ when the Raman ratio falls within the range from 6.5 to 7.5; and $7\times10^{17}$ $cm^{-3}$ when the Raman ratio is 7.5 or more.

Thus, it is possible to produce a high-efficiency photoelectric conversion device when the impurity concentration in the crystalline silicon i-layer is controlled so as to have a value equal to or less than the above-described upper limit corresponding to a desired Raman ratio.

Furthermore, the present invention provides a photoelectric-conversion-device fabrication method that includes a step of forming, on a substrate, a photoelectric conversion layer having an i-layer formed mainly of crystalline silicon, the method including the steps of: determining an upper limit of an impurity-gas concentration in a film-formation atmosphere according to the Raman ratio of the i-layer; and forming the i-layer while controlling the impurity-gas concentration so as to have a value equal to or less than the determined upper limit.

The impurity concentration in the crystalline silicon i-layer can be controlled by controlling the impurity-gas concentration during the film formation. Thus, it is possible to stably produce photoelectric conversion devices that maintain high cell performance.

In the above-described invention, it is preferable that the upper limit of the impurity-gas concentration be set to: 10 ppm when the Raman ratio falls within the range from 3.5 to 4.5; 8 ppm when the Raman ratio falls within the range from 4.5 to 5.5; 2 ppm when the Raman ratio falls within the range from 5.5 to 6.5; 1.5 ppm when the Raman ratio falls within the range from 6.5 to 7.5; and 2 ppm when the Raman ratio is 7.5 or more.

Thus, it is possible to produce a high-efficiency photoelectric conversion device when the impurity concentration in an i-layer film-formation atmosphere is controlled so as to have a value equal to or less than the above-described upper limit corresponding to a desired Raman ratio.

Advantageous Effects of Invention

According to the present invention, film formation can be performed while the impurity concentration in the film or in the film-formation atmosphere is controlled corresponding to the Raman ratio of the crystalline silicon i-layer film, and, therefore, high-performance photoelectric conversion devices can be stably produced.

BRIEF DESCRIPTION OF DRAWINGS

FIG. 3 is a schematic view for explaining the embodiment in which the solar cell panel is fabricated by using the photoelectric-conversion-device fabrication method of the present invention.

FIG. 4 is a schematic view for explaining the embodiment in which the solar cell panel is fabricated by using the photoelectric-conversion-device fabrication method of the present invention.

DESCRIPTION OF EMBODIMENTS

Figure 1:
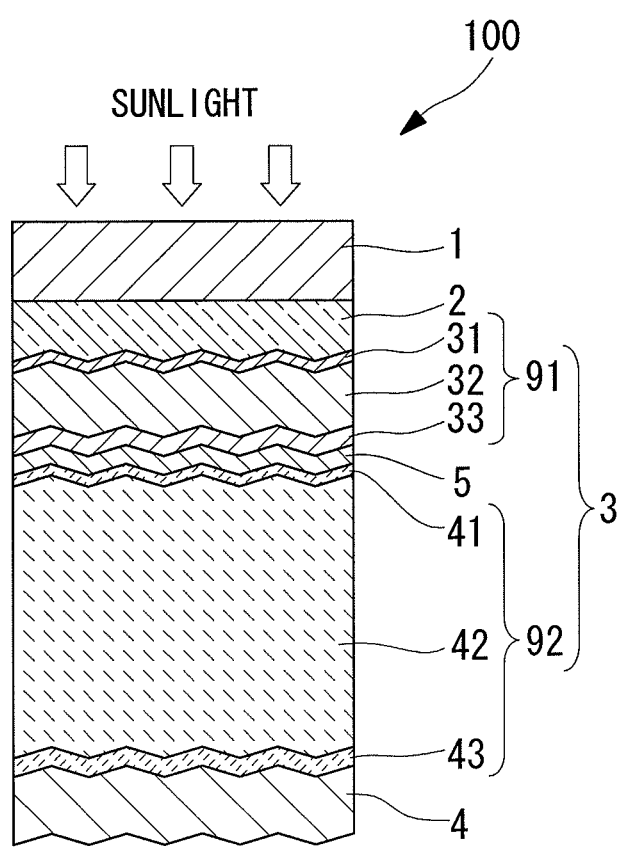
FIG. 1 is a view showing, in outline, the structure of a photoelectric conversion device fabricated by a photoelectric-conversion-device fabrication method of the present invention.
Figure 2:
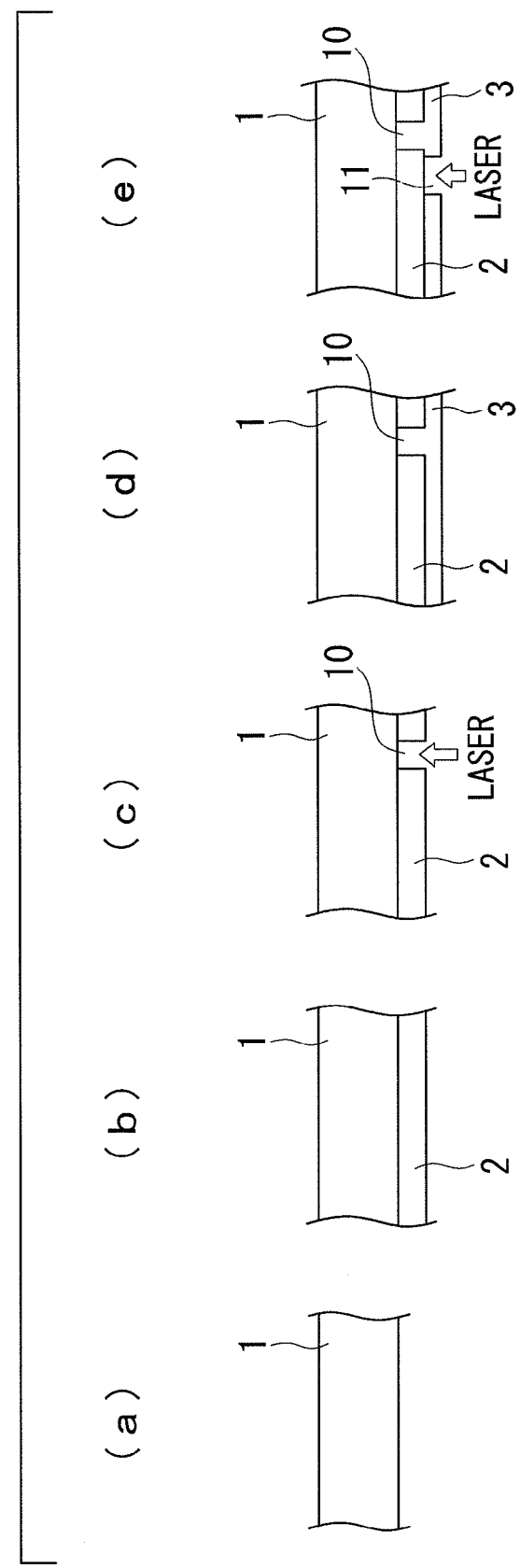
FIG. 2 is a schematic view for explaining one embodiment in which a solar cell panel is fabricated by using the photoelectric-conversion-device fabrication method of the present invention.

FIG. 1 is a view showing, in outline, the structure of a photoelectric conversion device of the present invention. A photoelectric conversion device 100 is a tandem-type silicon solar cell and is provided with a substrate 1, a transparent electrode layer 2, a first cell layer 91 (amorphous silicon) and a second cell layer 92 (crystalline silicon) that serve as a solar-cell photoelectric conversion layer 3, an intermediate contact layer 5, and a back electrode layer 4. Here, "silicon" is a general term including silicon (Si), silicon carbide (SiC), and silicon germanium (SiGe). Furthermore, "crystalline silicon" is intended to mean silicon other than amorphous silicon and also includes microcrystalline silicon and polycrystalline silicon.

First Embodiment

A photoelectric-conversion-device fabrication method according to a first embodiment will be described by using a process of fabricating a solar cell panel as an example. FIGS. 2 to 5 are schematic views showing a solar-panel fabrication method of this embodiment.

(1) FIG. 2(a)

As the substrate 1, soda float glass (for example, 1.4 m×1.1 m×plate thickness: 3.5 mm to 4.5 mm) is used. It is preferable that end faces of the substrate be subjected to corner chamfering processing or R-chamfering processing in order to avoid damage caused by thermal stress, impacts, or the like.

(2) FIG. 2(b)

As the transparent electrode layer 2, a transparent conducting film composed mainly of tin oxide ($SnO_2$) and having a film thickness of about 500 nm to 800 nm is formed at about 500° C. using a thermal CVD apparatus. At this time, a suitable uneven texture is formed on the surface of the transparent electrode film. As the transparent electrode layer 2, an alkali barrier film (not shown) may be formed between the substrate 1 and the transparent electrode film, in addition to the transparent electrode film. The alkali barrier film is obtained when a silicon oxide film ($SiO_2$) having a film thickness of 50 nm to 150 nm is formed at about 500° C. using a thermal CVD apparatus.

(3) FIG. 2(c)

Thereafter, the substrate 1 is placed on an X-Y table and is irradiated with the first harmonic (1064 nm) of a YAG laser from the film surface side of the transparent electrode layer, as shown by the arrow in the figure. The laser power is adjusted so as to be appropriate for the processing speed, and the laser light is moved relative to the substrate 1 in a direction perpendicular to the series-connection direction of power generation cells, thus applying laser etching to the transparent electrode layer in a rectangular shape with a predetermined width of about 6 mm to 15 mm, so as to form a groove 10.

(4) FIG. 2(d)

As the first cell layer 91, a p-layer, an i-layer, and an n-layer that are each formed of an amorphous silicon thin film are formed using a plasma CVD apparatus. An amorphous silicon p-layer 31, an amorphous silicon i-layer 32, and an amorphous silicon n-layer 33 are formed on the transparent electrode layer 2 in this order from the side on which sunlight is incident, by using $SiH_4$ gas and $H_2$ gas as main materials, under the following conditions: a low-pressure atmosphere of 30 Pa to 1000 Pa and a substrate temperature of about 200° C. The amorphous silicon p-layer 31 is formed mainly of B-doped amorphous silicon and has a film thickness of 10 nm to 30 nm. The amorphous silicon i-layer 32 has a film thickness of 200 nm to 350 nm. The amorphous silicon n-layer 33 is formed mainly of p-doped silicon, in which microcrystalline silicon is contained in amorphous silicon, and has a film thickness of 30 nm to 50 nm. A buffer layer may be provided between the amorphous silicon p-layer 31 and the amorphous silicon i-layer 32 in order to improve the interfacial properties.

Next, a crystalline silicon p-layer 41, a crystalline silicon i-layer 42, and a crystalline silicon n-layer 43 that serve as the second cell layer 92 are sequentially formed on the first cell layer 91 by using a plasma CVD apparatus under the following conditions: a low-pressure atmosphere of 3000 Pa or less, a substrate temperature of about 200° C., and a plasma generation frequency of 40 MHz to 100 MHz. The crystalline silicon p-layer 41 is formed mainly of B-doped microcrystalline silicon and has a film thickness of 10 nm to 50 nm. The crystalline silicon i-layer 42 is formed mainly of microcrystalline silicon and has a film thickness of 1.2 μm to 3.0 μm. The crystalline silicon n-layer 43 is formed mainly of p-doped microcrystalline silicon and has a film thickness of 20 nm to 50 nm.

When an i-layer film formed mainly of microcrystalline silicon is formed by using the plasma CVD method, it is preferable to set a distance d between the plasma discharge electrode and the surface of the substrate 1 at 3 mm to 10 mm. When it is less than 3 mm, it becomes difficult to keep the distance d constant because of the precision of individual constituent devices in a film-formation chamber compatible with large substrates, and there is a risk of the discharge becoming unstable when they get too close to each other. When it is more than 10 mm, it is difficult to achieve an adequate film-formation speed (1 nm/s or more), the plasma uniformity decreases, and the film quality is reduced due to ion bombardment.

The crystalline silicon i-layer 42 of this embodiment is controlled such that the impurity concentration in the film becomes equal to or less than an upper limit determined based on the Raman ratio of the crystalline silicon i-layer. Example impurities that may be mixed in the crystalline silicon i-layer during film formation and that influence the cell performance include nitrogen, oxygen, phosphorus, antimony, and arsenic.

Figure 6:
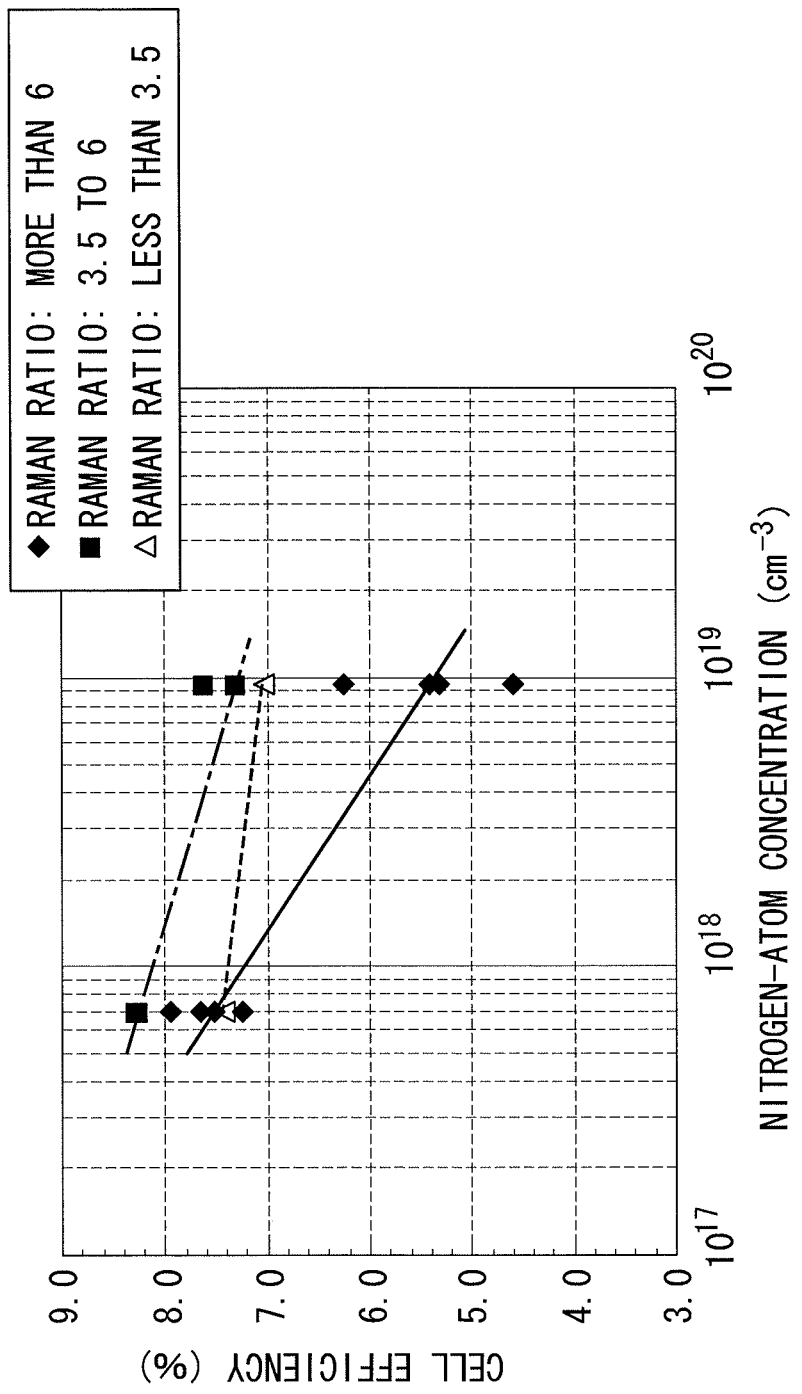
FIG. 6 is a graph showing the relationship between the nitrogen-atom concentration in a crystalline silicon i-layer and the cell efficiency.
Figure 7:
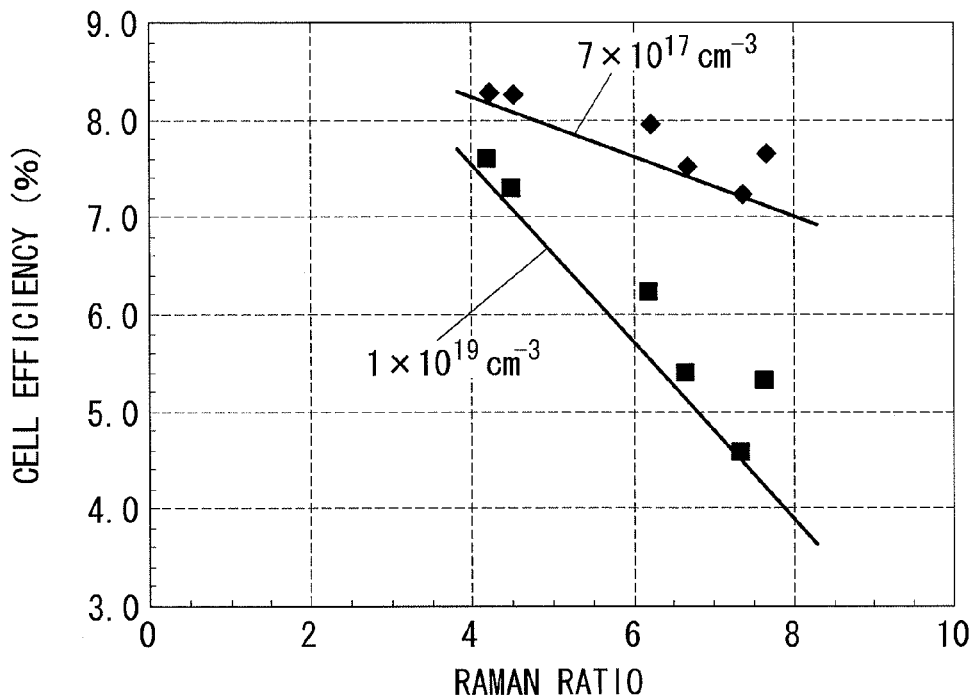
FIG. 7 is a graph showing the Raman ratio of the crystalline silicon i-layer and the influence of the nitrogen-atom concentration on the cell efficiency.

FIG. 6 is a graph showing the relationship between the cell efficiency and the nitrogen-atom concentration in each i-layer, in single-type solar cells having crystalline silicon i-layers of various Raman ratios. In this figure, the horizontal axis indicates the nitrogen-atom concentration, and the vertical axis indicates the cell efficiency. FIG. 7 is a graph showing the Raman ratio of the i-layer and the influence of the nitrogen-atom concentration on the cell efficiency. In the figure, the horizontal axis indicates the Raman ratio, and the vertical axis indicates the ratio of the cell efficiency of a crystalline silicon i-layer having a nitrogen-atom concentration of $1\times10^{19}$ cm$^{-3}$ to the cell efficiency of a crystalline silicon i-layer having a nitrogen-atom concentration of $7\times10^{17}$ cm$^{-3}$.

As shown in FIGS. 6 and 7, when the Raman ratio is 3.5 or less, the influence of the nitrogen-atom concentration in the i-layer film on the cell efficiency is almost the same, irrespective of the Raman ratio. On the other hand, when the Raman ratio exceeds 3.5, the magnitude of a reduction in the cell efficiency (cell performance) caused by an increase in the nitrogen-atom concentration in the i-layer film becomes larger as the Raman ratio becomes higher. From these results, it can be said that the crystalline (microcrystalline) silicon film is more likely to be influenced by the impurities than the amorphous silicon film is. It is conceivable that this is because the activation energy of the crystalline silicon is lower than the activation energy of the amorphous silicon. The activation energy of the crystalline silicon i-layer is 0.3 to 0.5 eV, and that of the amorphous silicon i-layer is 0.7 to 0.9 eV. Thus, the crystalline (microcrystalline) silicon and the amorphous silicon have different bonding states, and it is conceivable that the crystalline (microcrystalline) silicon is more likely to be activated by the impurities.

Figure 8:
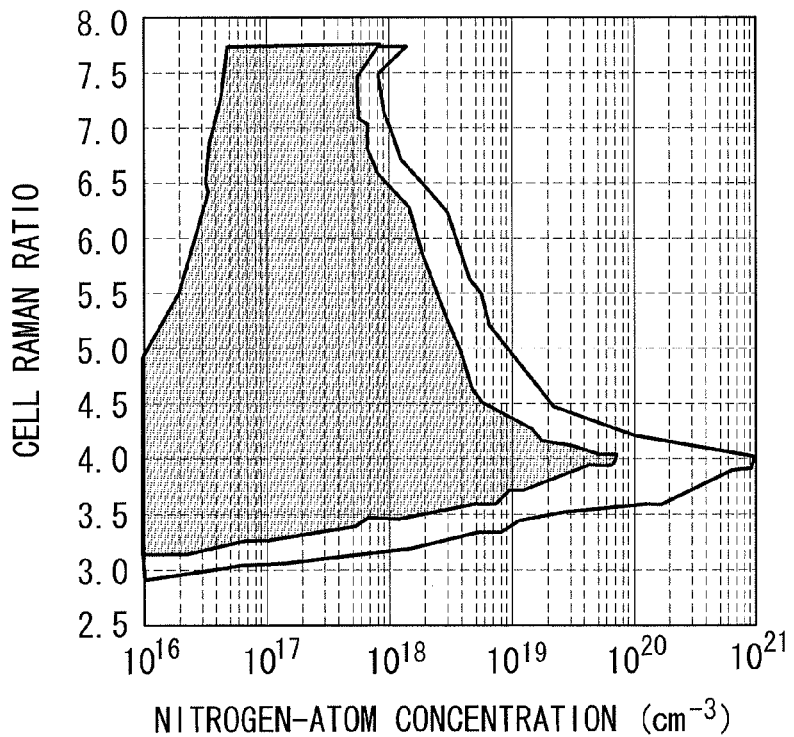
FIG. 8 is a graph of the distribution of the cell efficiency with respect to the nitrogen-atom concentration in the crystalline silicon i-layer and the Raman ratio of the crystalline silicon i-layer.

FIG. 8 is a graph of the distribution generated based on FIG. 6, showing the cell efficiency with respect to the nitrogen-atom concentration in the crystalline silicon i-layer and the Raman ratio of the crystalline silicon i-layer. In the figure, the horizontal axis indicates the nitrogen-atom concentration, and the vertical axis indicates the Raman ratio. To generate the graph of the distribution of FIG. 8, an approximate straight line is generated for plots in each of Raman ratio ranges shown in FIG. 6, and the nitrogen-atom concentration and the cell efficiency at each Raman ratio are obtained from the approximate straight line.

The upper limit of the nitrogen-atom concentration in the crystalline silicon i-layer is determined in consideration of the following prerequisites: (1) the Raman ratio is 3.5 or more (in order to obtain microcrystalline silicon); and (2) the cell efficiency is 7.5% or more (in order to maintain adequate performance as a commercial product). In FIG. 8, a cell efficiency of 7.5% or more can be achieved in the shaded area. Table 1 shows upper limits of the nitrogen-atom concentration in a film that can produce a cell efficiency of 7.5% or more in predetermined Raman-ratio ranges, from FIG. 8.

TABLE 1

| Raman ratio range | Upper limit of nitrogen-atom concentration in film (cm$^{-3}$) |
|---|---|
| 3.5-4.5 | $5 \times 10^{18}$ |
| 4.5-5.5 | $2 \times 10^{18}$ |
| 5.5-6.5 | $8 \times 10^{17}$ |
| 6.5-7.5 | $7 \times 10^{17}$ |
| 7.5- | $7 \times 10^{17}$ |

Specifically, it is possible to obtain a high-efficiency photoelectric conversion device when the nitrogen-atom concentration in the crystalline silicon i-layer is controlled so as to have a value equal to or less than the upper limit shown in Table 1 corresponding to a desired Raman ratio. Table 1 shows that it is necessary to perform control such that the nitrogen-atom concentration becomes lower as the Raman ratio becomes higher, in order to obtain a high-performance solar cell.

The values of the Raman-ratio ranges shown in Table 1 need to be appropriately set according to the Raman ratio control precision required in production.

To control the nitrogen-atom concentration in the crystalline silicon i-layer, a film formation method in which control is performed while monitoring the nitrogen-gas concentration in film-forming gas can be used. To control the nitrogen-gas concentration, it is possible to use a method in which a gas purifier is installed between a material-gas cylinder and the film-formation chamber to reduce the nitrogen-gas concentration in supply material gas or a method in which the temperature of the material gas is reduced to the temperature of liquid oxygen or lower to change the nitrogen partial pressure. Alternatively, when the measured nitrogen-gas concentration is high, the material-gas cylinder may be replaced with a material-gas cylinder having low nitrogen concentration.

If the impurity is oxygen, control can be performed while monitoring the oxygen gas concentration in the film-forming gas, as with the nitrogen.

The intermediate contact layer 5, which is a semi-reflective film, is provided between the first cell layer 91 and the second cell layer 92 in order to improve the contact properties and to achieve current consistency. As the intermediate contact layer 5, a GZO (Ga-doped ZnO) film with a film thickness of 20 nm to 100 nm is formed by a sputtering apparatus by using a Ga-doped ZnO sintered compact target. The intermediate contact layer 5 is not provided, in some cases.

(5) FIG. 2(e)

The substrate 1 is placed on the X-Y table and is irradiated with the second harmonic (532 nm) of a laser-diode-pumped YAG laser from the film surface side of the photoelectric conversion layer 3, as shown by the arrow in the figure. The laser power is adjusted so as to be appropriate for the processing speed, with a pulse oscillation of 10 kHz to 20 kHz, and laser etching is performed so as to form a groove 11 at a position about 100 μm to 150 μm away laterally from the laser etching line on the transparent electrode layer 2. The laser light may be radiated from the substrate 1 side, and in this case, because the photoelectric conversion layer 3 can be etched using high vapor pressure generated with the energy absorbed in the amorphous-silicon first cell layer of the photoelectric conversion layer 3, it is possible to perform laser etching even more stably. The position of the laser etching line is selected in consideration of the positional tolerance so as not to intersect the etching line in the previous step.

(6) FIG. 3(a)

As the back electrode layer 4, an Ag film/Ti film are formed by using a sputtering apparatus with a low-pressure atmosphere and a film-formation temperature of about 150° C. to 200° C. In this embodiment, an Ag film having a film thickness of 150 nm to 500 nm and a Ti film having a film thickness of 10 nm to 20 nm, which has a high anti-corrosion effect and serves to protect the Ag film, are laminated in this order. Alternatively, the back electrode layer 4 may have a laminated structure of an Ag film having a film thickness of 25 nm to 100 nm and an Al film having a film thickness of 15 nm to 500 nm. In order to improve the light reflectivity and reduce the contact resistance of the crystalline silicon n-layer 43 and the back electrode layer 4, a GZO (Ga-doped ZnO) film having a film thickness of 50 nm to 100 nm may be formed between the photoelectric conversion layer 3 and the back electrode layer 4, using a sputtering apparatus.

(7) FIG. 3(b)

The substrate 1 is placed on the X-Y table and is irradiated with the second harmonic (532 nm) of a laser-diode-pumped YAG laser from the substrate 1 side, as shown by the arrow in the figure. The laser light is absorbed in the photoelectric conversion layer 3, and the back electrode layer 4 is removed by blasting using the high gas vapor pressure generated during this process. The laser power is adjusted so as to be appropriate for the processing speed, with a pulse oscillation of 1 kHz to 10 kHz, and laser etching is performed so as to form a groove 12 at a position about 250 μm to 400 μm away laterally from the laser etching line on the transparent electrode layer 2.

(8) FIG. 3(c) and FIG. 4(a)

The power generation region is divided, and laser etching is performed at film edge portions near the substrate edges, thus removing the risk of short-circuiting the series-connected portions. The substrate 1 is placed on the X-Y table and is irradiated with the second harmonic (532 nm) of a laser-diode-pumped YAG laser from the substrate 1 side. The laser light is absorbed in the transparent electrode layer 2 and the photoelectric conversion layer 3, and the back electrode layer 4 is removed by blasting using the high gas vapor pressure generated during this process, thereby removing the back electrode layer 4/the photoelectric conversion layer 3/the transparent electrode layer 2. The laser power is adjusted so as to be appropriate for the processing speed, with a pulse oscillation of 1 kHz to 10 kHz, and laser etching is performed so as to form an X-direction insulating groove 15 at a position 5 mm to 20 mm away from the edge of the substrate 1, as shown in FIG. 3(c). Note that, since FIG. 3(c) is an X-direction sectional view seen from the direction in which the photoelectric conversion layers 3 are serially connected, a surrounding film-removed region 14 where the back electrode layer 4/the photoelectric conversion layer 3/the transparent electrode layer 2 are removed through film polishing should be located at the position of the insulating groove 15 (see FIG. 4(a)); however, for the sake of convenience in explaining the processing applied to the edge of the substrate 1, a description will be given of a case where a Y-direction section is shown at this position, and the formed insulating groove is shown as the X-direction insulating groove 15. At this time, it is not necessary to provide a Y-direction insulating groove because a film-surface polishing and removing process is applied to the surrounding film-removed region on the substrate 1 at a later step.

Terminating the etching for the insulating groove 15 at positions 5 mm to 15 mm away from the edges of the substrate 1 is preferable because it affords an advantage in that it is effective in suppressing the ingress of external moisture from the edge of a solar cell panel into the interior of a solar cell module 6.

Note that a YAG laser is used as laser light in the above-described steps; however, a YVO4 laser or a fiber laser can be similarly used.

(9) FIG. 4(a: a View Seen from the Solar-Cell Film Surface Side and b: a View Seen from the Substrate Side, which is a Light-Receiving Surface)

Since the laminated films at the regions surrounding the substrate 1 (at the surrounding film-removed region 14) are uneven and likely to be peeled off, the films are removed to form the surrounding film-removed region 14, in order to provide a sound joining/sealing surface with a back sheet 24 via an EVA in a later step. To remove the films in the whole surrounding region with a width of 5 to 20 mm from the edges of the substrate 1, the back electrode layer 4/the photoelectric conversion layer 3/the transparent electrode layer 2 are removed through grindstone polishing or blast polishing in portions closer, in the X direction, to the substrate edges than the insulating groove 15 provided in the above-described step shown in FIG. 3(c) is and in portions closer, in the Y direction, to the substrate edges than the grooves 10 that are formed near the substrate edges are.

Polishing dust or abrasive grains are removed by washing the substrate 1.

(10) FIGS. 5(a) and 5(b)

An open through-window is provided in the back sheet 24 at a position where a terminal housing 23 is mounted, to lead out a current-collecting plate. A plurality of layers formed of insulating materials are provided for the open through-window to suppress the ingress of external moisture etc.

Processing is performed so as to collect power, using copper foil, from the serially-arranged solar-cell power generation cells at one end and at the other end and to extract the power from the portion of the terminal housing 23 provided at the rear side of the solar cell panel. An insulating sheet having a larger width than the copper foil is disposed in order to prevent a short circuit between the copper foil and each part.

After the power-collecting copper foil etc. are disposed at predetermined locations, an adhesive packing sheet, such as EVA (ethylene vinyl acetate copolymer), is disposed so as to cover the entire solar cell module 6 and so as not to stick out from the substrate 1.

The back sheet 24, having a high waterproofing effect, is provided on the EVA. In this embodiment, the back sheet 24 is formed into a three-layer structure of PET sheet/Al foil/ PET sheet, so as to achieve a high waterproofing and damp-proofing effect.

After the back sheet 24 is disposed at the predetermined location, while the inner air is deaerated in the low-pressure atmosphere by means of a laminator and pressing is performed at about 150 to 160° C., the EVA is cross-linked for sealing.

Figure 5:
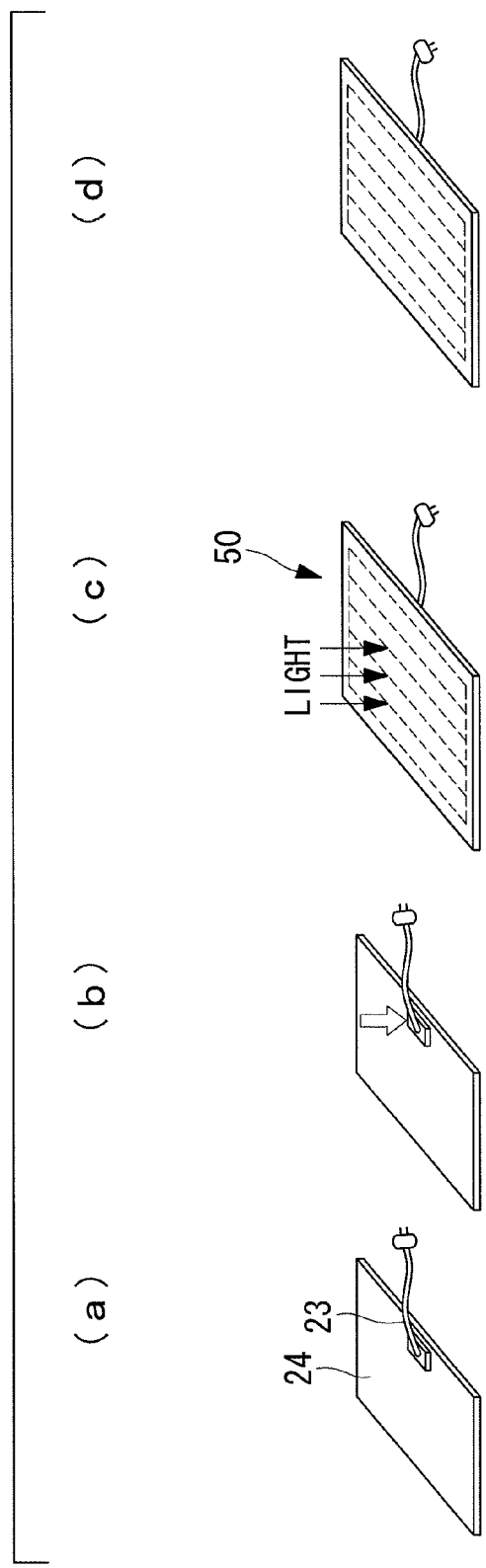
FIG. 5 is a schematic view for explaining the embodiment in which the solar cell panel is fabricated by using the photoelectric-conversion-device fabrication method of the present invention.

(11) FIG. 5(*a*)

The terminal housing 23 is mounted on the rear side of the solar cell module 6 with an adhesive agent.

(12) FIG. 5(*b*)

The copper foil and an output cable of the terminal housing 23 are connected by solder or the like, and the interior of the terminal housing 23 is filled with sealant (potting material) and sealed. Thus, a solar cell panel 50 is completed.

(13) FIG. 5(*c*)

A power generation check and predetermined performance tests are performed on the solar cell panel 50 formed through the steps up to the step shown in FIG. 5(*b*). The power generation check is performed using a solar simulator for an AM of 1.5 and global-solar-radiation standard sunlight (1000 W/m$^2$).

(14) FIG. 5(*d*)

Before or after the power generation check (FIG. 5(*c*)), predetermined performance tests, such as a visual inspection, are executed.

Second Embodiment

In a photoelectric-conversion-device fabrication method according to a second embodiment, when the crystalline silicon i-layer 42 is formed, the impurity-gas concentration in the film-formation atmosphere is controlled. The impurity gases in the film-formation atmosphere include nitrogen gas and oxygen gas that are contained in $SiH_4$ gas and $H_2$ gas, and also include $PH_3$, which is n-layer material gas remaining in the film-formation chamber.

Figure 9:
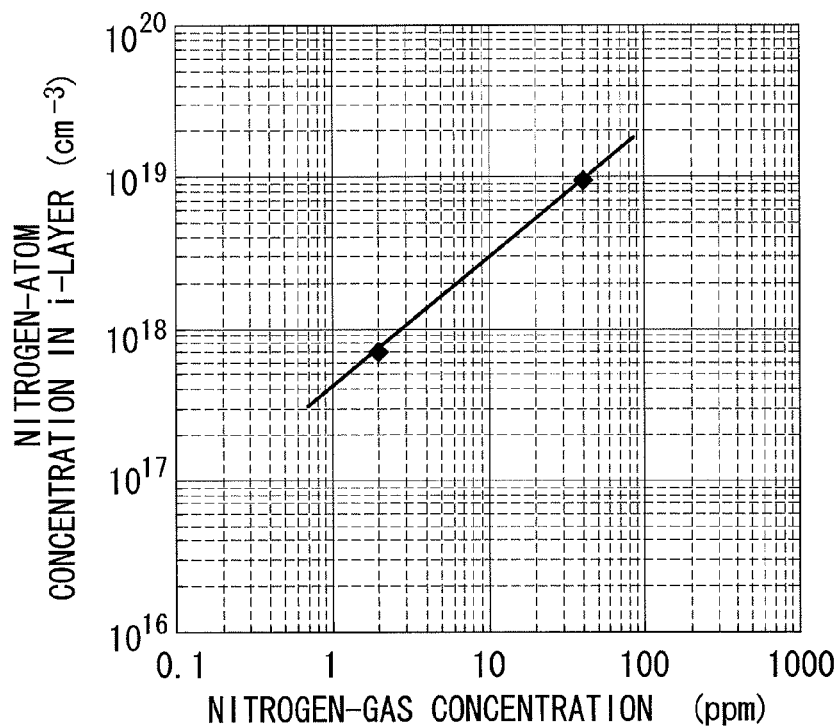
FIG. 9 is a graph showing the relationship between the nitrogen-gas concentration in the film-formation atmosphere and the nitrogen-atom concentration in the crystalline silicon i-layer.

There is a correspondence relationship between the impurity-gas concentration in the film-formation atmosphere and the impurity concentration in the crystalline silicon i-layer. FIG. 9 shows the relationship between the nitrogen-gas concentration in the film-formation atmosphere and the nitrogen-atom concentration in the crystalline silicon i-layer, as an example. FIG. 9 shows a linear relationship between the nitrogen-gas concentration and the nitrogen-atom concentration in the film.

The nitrogen-atom concentration in the film shown in FIG. 6 is converted into the nitrogen-gas concentration in the film-formation atmosphere by using the correspondence relationship shown in FIG. 9, and a graph of the distribution of the cell efficiency with respect to the nitrogen-gas concentration in the film-formation atmosphere and the Raman ratio is obtained. In the graph of the distribution shown in FIG. 10, the horizontal axis indicates the nitrogen-gas concentration, and the vertical axis indicates the Raman ratio.

Figure 10:
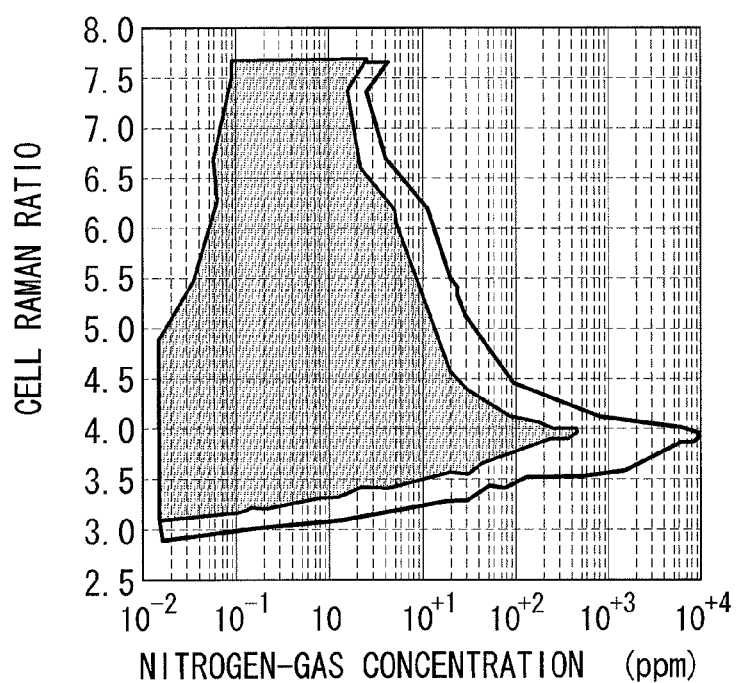
FIG. 10 is a graph of the distribution of the cell efficiency with respect to the nitrogen-gas concentration in the film-formation atmosphere and the Raman ratio.

Based on FIG. 10, the upper limits of the nitrogen-gas concentration in the film-formation atmosphere are determined in consideration of the same prerequisites as those in the first embodiment. In FIG. 10, a cell efficiency of 7.5% or more can be achieved in the shaded area. Table 2 shows the upper limits of the nitrogen-gas concentration that can produce a cell efficiency of 7.5% or more in predetermined Raman-ratio ranges.

TABLE 2

| Raman ratio range | upper limit of nitrogen-gas concentration (ppm) |
|---|---|
| 3.5-4.5 | 10 |
| 4.5-5.5 | 8 |
| 5.5-6.5 | 2 |
| 6.5-7.5 | 1.5 |
| 7.5- | 2 |

Specifically, it is possible to obtain a high-efficiency photoelectric conversion device when the nitrogen-gas concentration in the film-formation atmosphere is controlled so as to have a value equal to or less than the upper limit shown in Table 2 corresponding to a desired Raman ratio. Table 2 shows that it is necessary to perform control such that the nitrogen-gas concentration becomes lower as the Raman ratio becomes higher. The values of the Raman-ratio ranges shown in Table 2 need to be appropriately set according to the Raman ratio control precision required in production.

Figure 11:
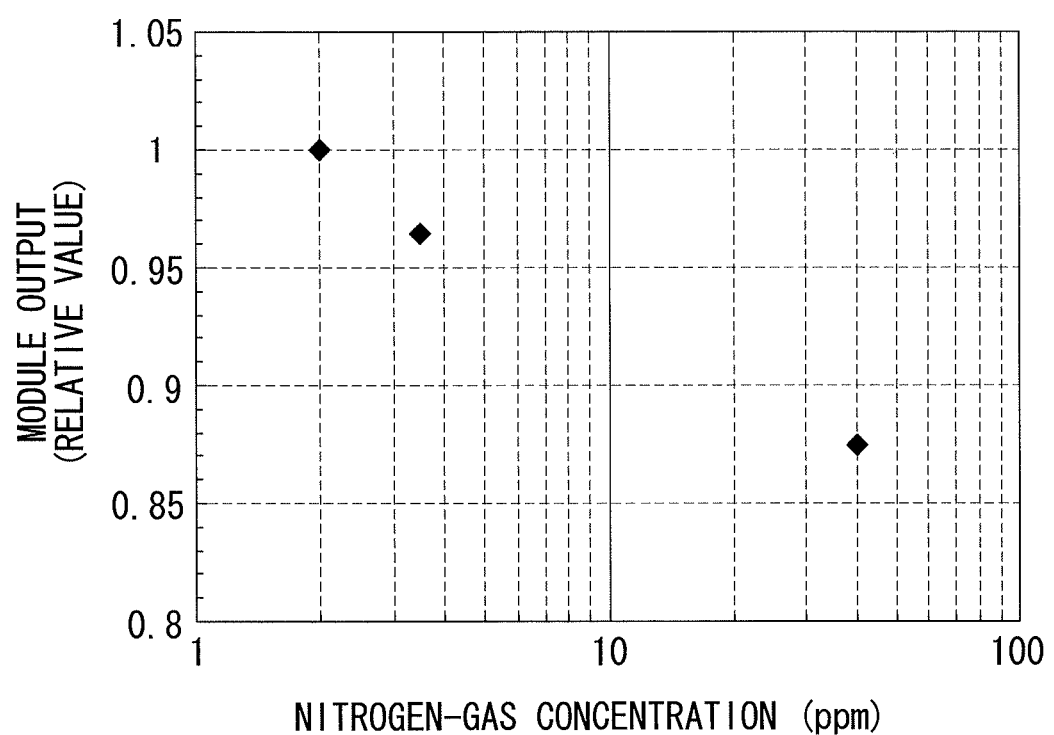
FIG. 11 is a graph showing the relationship between the nitrogen-gas concentration while the crystalline silicon i-layer is formed and the output of a tandem-type solar cell module.

FIG. 11 shows the relationship between the nitrogen-gas concentration during film-formation of a crystalline silicon i-layer and the module output, in a tandem-type solar cell module that has the crystalline silicon i-layer formed while the nitrogen-gas concentration in the atmosphere is controlled. In the figure, the horizontal axis indicates the nitrogen-gas concentration, and the vertical axis indicates the relative value of the module output with respect to the module output obtained at a nitrogen-gas concentration of 2 ppm. The same film-formation conditions were used, except for the nitrogen-gas concentration, to obtain the graph of FIG. 11. Note that the Raman ratio of the crystalline silicon i-layer has a distribution ranging from 4 to 10 in a plane, and the average thereof is 6.5.

As shown in FIG. 11, the output is reduced as the nitrogen-gas concentration becomes higher. Under the condition of an in-plane average Raman ratio of 6.5, a high output can be ensured when the nitrogen-gas concentration in the film-formation atmosphere is controlled so as to have a value equal to or less than 2 ppm.

The nitrogen (impurity) gas concentration in the film-formation atmosphere is measured by gas chromatography or the like. As described in the first embodiment, the nitrogen-gas concentration is controlled so as to have a value equal to or less than each of the above-described upper limits, by a method in which a gas purifier is used to reduce the nitrogen-gas concentration in the supply material gas, a method in which the temperature of the material gas is reduced to the temperature of liquid oxygen or lower to change the nitrogen partial pressure, or a method in which the material-gas cylinder is replaced with a material-gas cylinder having low nitrogen concentration.

If the impurity is oxygen, control can be performed while monitoring the oxygen gas concentration in the film-forming gas, as with the nitrogen.

During the solar-cell production process, the Raman ratio of the crystalline silicon i-layer can be estimated by a method in which the image of the surface of a formed crystalline silicon i-layer is acquired online, and it is determined whether there is a region that looks white (referred to as a high-intensity reflection region) or a method in which infrared light is incident from the glass substrate side, and the reflected light is measured online. Alternatively, the Raman ratio of the crystalline silicon i-layer may be directly measured.

A description has been given of the tandem-type solar cell as the solar cell in the above-described embodiments; however, the present invention is not limited to this example. The present invention can be applied to other types of thin-film solar cell having a crystalline silicon i-layer, such as a single-type solar cell and a triple-type solar cell.

{Reference Signs List}

| | |
|---|---|
| 1 | substrate |
| 2 | transparent electrode layer |
| 3 | photoelectric conversion layer |
| 4 | back electrode layer |
| 5 | intermediate contact layer |
| 6 | solar cell module |
| 31 | amorphous silicon p-layer |
| 32 | amorphous silicon i-layer |
| 33 | amorphous silicon n-layer |
| 41 | crystalline silicon p-layer |
| 42 | crystalline silicon i-layer |
| 43 | crystalline silicon n-layer |
| 91 | first cell layer |
| 92 | second cell layer |
| 100 | photoelectric conversion device |

The invention claimed is:

1. A photoelectric-conversion-device fabrication method that includes a step of forming, on a substrate, a photoelectric conversion layer having an i-layer formed mainly of crystalline silicon to fabricate a photoelectric conversion device having the photoelectric conversion layer, the method further comprising the steps of:
obtaining a relationship between a Raman ratio of the i-layer, a nitrogen-atom concentration, and an efficiency of the photoelectric conversion device;
determining an upper limit of the nitrogen-atom concentration in the i-layer at a predetermined Raman ratio of the i-layer on the basis of the obtained relationship; and
forming the i-layer having the predetermined Raman ratio by controlling the nitrogen-atom concentration so as to have a value equal to or less than the determined upper limit of the nitrogen-atom concentration.

2. A photoelectric-conversion-device fabrication method that includes a step of forming, on a substrate, a photoelectric conversion layer having an i-layer formed mainly of crystalline silicon to fabricate a photoelectric conversion device having the photoelectric conversion layer, the method further comprising the steps of:
obtaining a relationship between a Raman ratio of the i-layer, a nitrogen-atom concentration in a film-formation atmosphere for forming the i-layer, and an efficiency of the photoelectric conversion device;
determining an upper limit of the nitrogen-gas concentration in a film-formation atmosphere at a predetermined Raman ratio of the i-layer on the basis of the obtained relationship; and
forming the i-layer having the predetermined Raman ratio while controlling the nitrogen-gas concentration so as to have a value equal to or less than the determined upper limit.

3. A method, comprising:
fabricating a photoelectric conversion device by executing a method including forming, on a substrate, a photoelectric conversion layer having an i-layer formed mainly of crystalline silicon, wherein forming the photoelectric layer includes:
obtaining a relationship between a Raman ratio of the i-layer and a nitrogen-atom concentration of at least one of the i-layer or an i-layer-formation atmosphere;
determining an upper limit of the nitrogen-atom concentration in at least one of the i-layer or the i-layer-formation atmosphere at a predetermined Raman ratio of the i-layer on the basis of the obtained relationship; and
controlling the nitrogen-atom concentration in at least one of the i-layer or the i-layer-formation atmosphere so as to have a value equal to or less than the determined upper limit of the nitrogen-atom concentration in at least one of the i-layer or the i-layer-formation atmosphere.

4. The method of claim 3, wherein forming the photoelectric layer includes:
obtaining a relationship between a Raman ratio of the i-layer and a nitrogen-atom concentration of the i-layer;
determining an upper limit of the nitrogen-atom concentration in the i-layer at a predetermined Raman ratio of the i-layer on the basis of the obtained relationship; and
controlling the nitrogen-atom concentration in the i-layer so as to have a value equal to or less than the determined upper limit of the nitrogen-atom concentration in the i-layer.

5. The method of claim 3, wherein forming the photoelectric layer includes:
obtaining a relationship between a Raman ratio of the i-layer and a nitrogen-atom concentration of an i-layer-formation atmosphere;
determining an upper limit of the nitrogen-atom concentration in the i-layer-formation atmosphere at a predetermined Raman ratio of the i-layer on the basis of the obtained relationship; and
controlling the nitrogen-atom concentration in the i-layer-formation atmosphere so as to have a value equal to or less than the determined upper limit of the nitrogen-atom concentration in the i-layer-formation atmosphere.

6. The method of claim 3, wherein the action of obtaining a relationship includes obtaining a relationship between a Raman ratio of the i-layer, a nitrogen-atom concentration in at least one of the i-layer or the i-layer-formation atmosphere, and an efficiency of the fabricated photoelectric conversion device.

* * * * *